(12) United States Patent
Yeung (10) Patent No.: US 10,794,543 B2
(45) Date of Patent: Oct. 6, 2020

(54) SUBSTRATE FOR LED PACKAGING, LED PACKAGE, AND LED BULB

(71) Applicant: Chi Keung Yeung, Hong Kong (CN)

(72) Inventor: Chi Keung Yeung, Hong Kong (CN)

( * ) Notice: Subject to any disclaimer, the term of this patent is extended or adjusted under 35 U.S.C. 154(b) by 349 days.

(21) Appl. No.: 15/752,341

(22) PCT Filed: Aug. 12, 2016

(86) PCT No.: PCT/CN2016/094806
§ 371 (c)(1),
(2) Date: Feb. 13, 2018

(87) PCT Pub. No.: WO2017/028740
PCT Pub. Date: Feb. 23, 2017

(65) Prior Publication Data
US 2020/0166182 A1    May 28, 2020

(30) Foreign Application Priority Data

Aug. 14, 2015  (CN) ..................... 2015 2 0613936 U
Aug. 14, 2015  (CN) ..................... 2015 2 0613974 U
Aug. 14, 2015  (CN) ..................... 2015 2 0615066 U (51) Int. Cl.
*F21K 9/232*     (2016.01)
*F21V 23/00*     (2015.01)
(Continued)

(52) U.S. Cl.
CPC ............ *F21K 9/232* (2016.08); *F21V 23/001* (2013.01); *F21V 23/006* (2013.01);
(Continued)

(58) Field of Classification Search
None
See application file for complete search history.

(56) References Cited

U.S. PATENT DOCUMENTS 9,488,767 B2 * 11/2016 Nava ..................... F21K 9/232
D804,063 S  * 11/2017 Yeung ............................ D26/2
(Continued)

FOREIGN PATENT DOCUMENTS

CN    203895497 U    10/2014
CN    204176377 U    2/2015
(Continued)

OTHER PUBLICATIONS

International Search Report for corresponding International Application No. PCT/CN2016/094806 dated Oct. 27, 2016 with English translation.
(Continued)

*Primary Examiner* — Britt D Hanley
(74) *Attorney, Agent, or Firm* — Renner, Otto, Boisselle & Sklar, LLP (57) ABSTRACT

The invention provides a substrate for LED packaging, a LED package and a LED bulb. The substrate is in a strip shape, at least one end of the substrate is provided with an electrode lead-out wire. The electrode lead-out wire is connected to the substrate by a connecting component and/or a connecting material, wherein at least one opening arranged along the length direction of the substrate is provided on the substrate. The LED package comprises the substrate, the substrate is provided with a plurality of LED chips, and the plurality of LED chips are connected in series and/or parallel with each other by connecting wires. The LED bulb of the present invention has the LED package. According to the invention, the openings in the middle part of the substrate make the arrangement and control of the LED chips on the substrate simpler and more diversified, which facilitates the air ventilation and heat dissipation of the LED package, makes the service life of the LED bulb longer, and makes the emitting angle more all-directional.

19 Claims, 4 Drawing Sheets

(51) Int. Cl.
  *H01L 25/075* (2006.01)
  *H01L 27/15* (2006.01)
  *H01L 33/62* (2010.01)
  *F21Y 115/10* (2016.01)

(52) U.S. Cl.
  CPC ........ *H01L 25/0753* (2013.01); *H01L 27/153* (2013.01); *H01L 33/62* (2013.01); *F21Y 2115/10* (2016.08)

(56) References Cited

U.S. PATENT DOCUMENTS

| | | | |
|---|---|---|---|
| D859,698 S * | 9/2019 | Yeung | D26/2 |
| 10,544,905 B2 * | 1/2020 | Jiang | H05B 45/00 |
| 10,563,824 B2 * | 2/2020 | Yeung | F21K 9/232 |
| 2004/0008525 A1 * | 1/2004 | Shibata | F21K 9/232 |
| | | | 313/271 |
| 2014/0369036 A1 * | 12/2014 | Feng | F21K 9/23 |
| | | | 362/223 |
| 2016/0238199 A1 * | 8/2016 | Yeung | F21V 3/049 |
| 2016/0377237 A1 * | 12/2016 | Zhang | H01L 27/15 |
| | | | 362/311.02 |
| 2017/0012177 A1 * | 1/2017 | Trottier | H01L 25/0753 |
| 2017/0167663 A1 * | 6/2017 | Hsiao | F21K 9/237 |

FOREIGN PATENT DOCUMENTS

| | | |
|---|---|---|
| CN | 104465638 A | 3/2015 |
| CN | 204289520 U | 4/2015 |
| CN | 204901412 U | 12/2015 |
| CN | 204905290 U | 12/2015 |
| CN | 204905300 U | 12/2015 |
| JP | 2013-026061 A | 2/2013 |

OTHER PUBLICATIONS

Written Opinion of the International Searching Authority for corresponding International Application No. PCT/CN2016/094806 dated Oct. 27, 2016.

* cited by examiner

SUBSTRATE FOR LED PACKAGING, LED PACKAGE, AND LED BULB

This application is a national phase of International Application No. PCT/CN2016/094806 filed Aug. 12, 2016, and claims priority to CN 201520615066.1 filed Aug. 14, 2015, CN 201520613936.1 filed Aug. 14, 2015, and CN 201520613974.7 filed Aug. 14, 2015.

TECHNICAL FIELD

The present invention relates to the field of LED light source. In particular, the present invention relates to a substrate for LED packaging, LED package, and LED bulb.

BACKGROUND

In the application of LED light source, LED package technology is more important. In the prior art, there are different LED package methods, including a Lamp LED package, a Chip-On-Board LED package, a Surface-Mount-Device LED package, a System-In-package LED package, and so on. The different substrates for packages are used according to different LED package methods.

In general, a substrate for LED packaging of Chip-On-Board is the substrate made of a circuit board or a single material, such as metal, PVC, plexiglass, plastic, or the like. The shape of substrate is mostly a planar rectangle, a planar circular, or a planar strip, or the like. The edge of the substrate is usually a smooth curve or a straight line.

Moreover, when a prior substrate is mounted with LED chips and is sealed with the fluorescent glue, the emitted light is plane light. Even if a plurality of substrates are configured as a three dimensional luminous body, the phenomenon of uneven light emission around the luminous body is easy to occur due to incomplete overall structural design. When the substrate is an opaque material, such as metal, there is no light source on the side where the LED chip is not provided, so that the substrate cannot emit light in 360 degrees. And when that substrate is a transparent material, although it can be transmitted in 360 degrees, heat dissipation problem is usually encountered due to the generally poor heat dissipation coefficient of the transparent material.

In summary, the prior substrate and prior bulb for LED package of Chip-On-Board are not uniform in light emission angles, cannot emit light at multiple angles and levels, and are prone to meet heat dissipation problems, which will affect the light emission efficiency.

SUMMARY

To solve the above problems, the invention provide a substrate for LED packaging, an LED package and an LED bulb, which are easy to dissipate heat, and easy to distribute on LED chips and achieve multi-level polychromatic luminescence, and can achieve the omnidirectional luminescence.

The invention provide a substrate for LED packaging, said substrate is shaped in a strip, at least one end of said substrate has an electrode lead-out wire, said electrode lead-out wire is connected with said substrate by connecting components and/or connecting materials; wherein said substrate has at least one opening disposed along the lengthwise direction of the substrate.

Preferably, said substrate is shaped in spiral wires, and the spiral wires of said substrate are spaced.

Preferably, multiple said openings are provided, said openings are arranged with interval along the lengthwise direction of the substrate, or are arranged with interval along the width direction of the substrate, or are arranged with intervals both along the lengthwise direction of the substrate and along the width direction of the substrate.

Preferably, said opening is shaped in a strip, a polygon, or a circular.

Preferably, said substrate is shaped in an arc shape, a wave shape, or a strip shape formed by connecting a plurality of units Preferably, said substrate is shaped in a strip formed by a plurality of polygon units or a plurality of circular units.

Preferably, said substrate is shaped in a strip formed by a plurality of circular units, and said openings are a plurality of circular through-holes which are spaced along the lengthwise direction of said substrate and concentrically arranged with the corresponding circular units.

Preferably, said substrate comprises a plurality of segments, and the multiple said substrates are connected sequentially end to end.

Preferably, multiple said substrates are connected with each other via a connective component, and adjacent substrates are connected structurally to each other by said the connective component.

Preferably, said connecting component electrically connects circuit elements on the adjacent substrates, said connecting component comprises a non-conductive portion that wraps and connects the end portion of the adjacent substrates and a conductive portion located within the non-conductive portion, said conductive portion electrically connects to the circuit elements on the substrate via connecting wires.

In addition, to solve the technical problem, the present invention provides a LED package comprising a substrate on which a plurality of LED chips are arranged. Said substrate is the substrate for LED packaging as above, and said plurality of LED chips on the substrate are connected in series and/or parallel with each other via connecting wires.

Preferably, said substrate is provided with LED chips on both sides of said openings.

Preferably, said connecting component comprises a non-conductive portion that wraps and connects the ends of adjacent substrates and a conductive portion located within the non-conductive portion, the conductive portion is not in contact with the substrate connected by said connecting component, and the conductive portion is electrically connected to the LED chip on the substrate via connecting wires.

Preferably, the middle part of said substrate is provided with an electrode lead-out wire, wherein the electrode lead-out wire is electrically connected with an LED chip on the substrate.

Preferably, said connecting component is electrically connected to an LED chip on at least part substrate of the plurality of substrates, and the connecting component is electrically connected to an electrode lead-out wire via which it is connected to the power supply.

In addition, to solve the technical problem, the present invention provides a LED bulb comprising a transparent bubble shell, a stem arranged in the transparent bubble shell, at least one LED package, an electrical connector positioned below the transparent bubble shell, and a driver connected with the electrical connector and positioned in the electrical connector, and wherein said stem is provided with two lead-out wires, the lead-out wires are respectively connected with electrode lead-out wires of the LED package in said transparent bubble shell, and the other end of the lead-out wires are connected with the driver, so that said LED package is connected with said electric connector by said driver, said transparent bubble shell and the stem are sealed, and a closed space is formed in the transparent bubble shell. Said LED package is the LED package in any of that above.

Compared with prior art, the advantage of the present invention is that: through the opening of the middle of the substrate, the arrangement and control of the LED chip on the substrate can be simpler and more diversified, and the LED chip can be easily set up into different light-emitting blocks, and the LED chips of the different light-emitting blocks may form different colors, color temperature, brightness and indication, and different blocks of LED chips can be controlled separately to form an intelligent lighting control system. The setting of openings is favorable for air ventilation and heat dissipation of the package, so that the life of the led bulb is longer. Moreover, the light from LED chips can be transmitted to the back or other surfaces through the opening of the middle of the substrate, so that the luminous angle become more omni bearing.

DETAILED DESCRIPTION OF THE EMBODIMENTS

The present invention is further described in details in connection with the embodiments as shown in the figures.

First Embodiment

Figure 1:
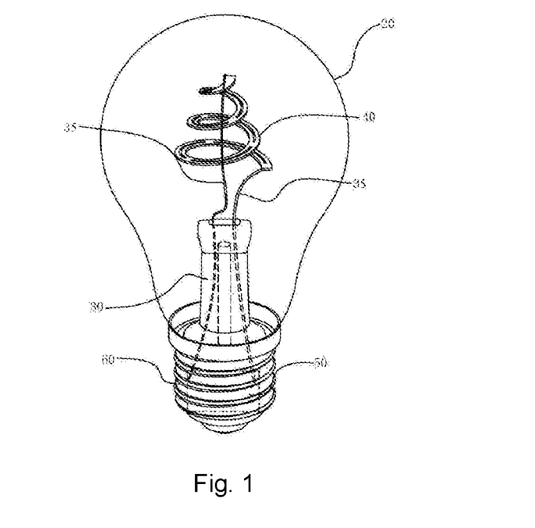
FIG. 1 is a schematic diagram of LED bulb of the first embodiment of the present invention.

As shown in FIG. 1, a schematic diagram of an LED bulb of the first embodiment of the present invention is shown. The bulb comprises a transparent bubble shell 20, and a stem 30 is arranged in the transparent bubble shell 20, and two lead-out wires 35 are arranged on the stem 30, and at least one LED package 40 is connected to the lead-out wires 35. In the transparent bubble shell 20, said two lead-out wires 35 are respectively connected to two electrode lead-out wires of the LED package 40, and the other ends of the two lead-out wires 35 are connected to a driver 50. Said driver 50 is connected to an electrical connector 60 and located in the electrical connector 60 which is located below the transparent bubble shell 20, for connecting an external power supply.

The transparent bubble shell 20 and the stem 30 are sealed, and the sealed space formed by the transparent bubble shell 20 can be filled with a gas for protecting the LED package and facilitating the heat dissipation of the LED package. The gas may be helium or a mixture of hydrogen and helium. Said transparent bulb 20 may be a transparent, milky, frosted, or colored bulb, or may be a bulb partially provided with a reflective layer, or partially provided with a small prism or a small lens. The shape of the transparent bulb 20 may be A type, G type, R type, PAR type, T type, candle type, or other conventional lamp bulb shape. The electrical connector 60 is one of conventional electrical connectors, such as E40, E27, E26, E14, and GU.

Figure 2:
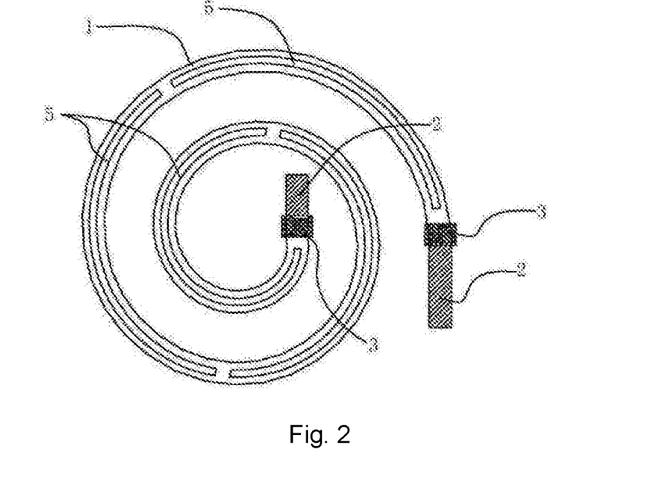
FIG. 2 is a schematic diagram of the substrate for LED packaging of the first embodiment of the present invention.
Figure 3:
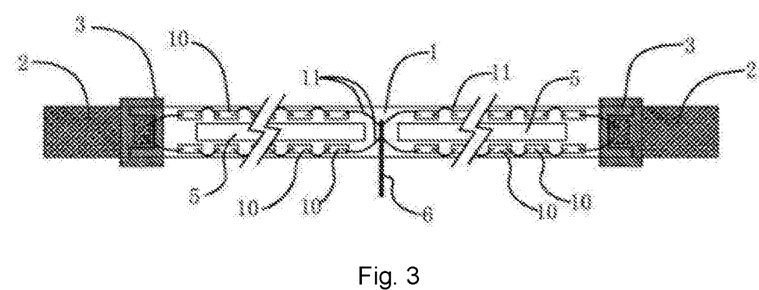
FIG. 3 is a detail diagram of LED package of the first embodiment of the present invention.

FIG. 2 is a schematic diagram of a substrate for LED packaging of the first embodiment of the present invention. FIG. 3 is a detailed schematic diagram of an LED package of the first embodiment of the present invention. As shown in FIGS. 2 and 3, the LED package 40 of the first embodiment of the present invention includes a strip-shaped substrate 1. The electrode lead-out wires 2 are fixed at both ends of said substrate 1 by a connecting component 3 and/or a connecting material which may be glue, ceramic glue, low melting point glass, silver paste, or plastic.

As shown in FIG. 1, the LED package 40 of the present invention has a three-dimensional spiral shape. As shown in FIG. 2, the substrate 1 of the first embodiment of the present invention is a spiral strip-shaped substrate, and the spiral lines of the substrate 1 are spaced. Preferably, the spiral strip is not in contact with each other and has intervals when the substrate 1 is in the same plane. The substrate 1 may be a circular spiral line, or an elliptical spiral line, or a spiral line connected in form of other polygons such as a square, a pentagon, a hexagon, and so on, or a regular geometric shape, or an irregular geometric shape. The spiral strip-shaped substrate 1 comprises at least ½ helical turns.

The material of the substrate 1 may be one of metal, plexiglass, PVC, plastic, sapphire, ceramic or silica gel, or a plurality of materials of the above materials made in a continuous or nested manner.

As shown in FIG. 2, the substrate 1 is provided with at least one opening 5 extending in the lengthwise direction of the substrate 1. When there are multiple openings 5, the openings 5 are spaced apart in the lengthwise direction of the substrate 1. The openings 5 may be provided with intervals along the width direction of the substrate 1, or may be provided with intervals along the length direction and along the width direction at the same time.

The opening 5 divides the substrate 1 into a plurality of mutually connected parts. The arrangement of the opening 5 not only can increase the heat dissipation of the substrate 1, but also is beneficial to light emitted from an LED chip to be transmitted to the opposite surface of the LED chip through the opening 5, thereby achieve more omni-bearing light transmission. In addition, the openings 5 may also facilitate the arrangement of LED chips on the substrate.

As shown in FIG. 3, in addition to a substrate 1 shown in FIG. 2, electrode lead-out wires 2 provided at both ends of the substrate 1, and a connecting component 3 and/or a connecting material which connects the electrode lead-out wires 2 and the substrate 1, the LED package of the first embodiment of the present invention includes a plurality of LED chips 10 fixed to the substrate 1 at both sides of the opening 5 by a non-conductive adhesive (e.g., silica gel, modified resin, epoxy resin, etc.) or conductive adhesive (e.g., silver adhesive or copper adhesive, etc.).

Connection wires 11 may be used to connect the LED chips 10 or connect the LED chips 10 and the electrode lead-out wires 2. The LED chips 10 on the substrate 1 on both sides of each opening 5 may be connected in series with each other via the connecting wires 11, or the two groups of LED chips 10 on both sides of each opening 5 may be connected in parallel with each other via the connecting wires 11, or may be connected in series and parallel with each other. The user may connect the LED chips 10 as required.

As shown in FIG. 3, an electrode lead-out wire 6 is also provided between two adjacent openings 5. Said the electrode lead-out wire 6 is electrically connected with the series-connected LED chips on both sides of the openings 5, so that a plurality of groups of LED chips on both sides of the plurality of openings 5 are connected in parallel with each other. That is, the plurality of LED chips 10 are connected in series with each other via the connecting wires 11, and a plurality of groups of LED chips 10 are connected in parallel with each other via the connecting wires 11. The electrode lead 2 of the LED package 40 of the present invention and the electrode lead-out wires 6 in the middle of the substrate 1 may be connected to the lead-out wire 35 of the stem 30.

This makes the arrangement and control of LED chips simpler and more diversified. The user can connect a plurality of LED chips in series and parallel as required, and arrange LED chips in different colors. Moreover, the existence of the opening 5 leads the brightness of the whole LED package higher, so that the light of the LED chip can be transmitted to the back surface or other surfaces through the opening 5, and the light emitting angle is more omni-bearing. In addition, if the printed circuit is printed on the substrate 1, the LED chips on the substrate 1 may not be connected to each other via the connecting wires 11. That is, the LED chips may be connected to each other directly by the printed circuit.

And the surfaces of the LED chip 10 and the substrate 1 are coated with a dielectric layer with a protective or luminescent function, wherein the dielectric layer is a combination of one or more of silica gel, epoxy resin adhesive and LED luminescent powder adhesive.

Second Embodiment

Figure 4:
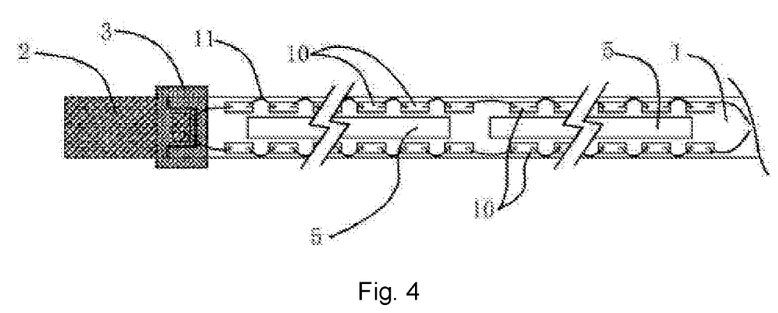
FIG. 4 is a detail diagram of LED package of the second embodiment of the present invention.

As shown in FIG. 4, a detailed schematic diagram of a LED package of the second embodiment of the present invention is shown. In this embodiment, the components and structures of the LED bulb, except for the LED package, are the same as those in the first embodiment described above, and will not be described here.

The LED package of the second embodiment of the present invention includes a substrate 1 which differs from the substrate of the first embodiment in that one of both ends of the substrate 1 is provided with an electrode lead-out wire 2, and the electrode lead-out wire 2 is connected to the substrate 1 via a connecting component 3 and/or a connecting material. On the other side, the other end of the substrate 1 is not provided with an electrode lead-out wire, and the substrate itself is used as another electrode lead-out wire. Using the substrate itself as a lead-out wire of that other electrode is more favorable for the heat dissipation of the LED chip on the substrate.

Further, as shown in FIG. 4, the substrate 1 is provided with a plurality of openings 5 which are spaced apart along the lengthwise direction thereof and extend along the lengthwise direction thereof. The openings 5 divide the substrate 1 into two parts in the width direction. Each side of the opening 5 is provided with a plurality of LED chips 10. Said plurality of LED chips 10 of each side are connected in series with each other via a connecting wire 11. The LED chips 10 of each side are connected with electrode lead-out wires at both ends of the substrate 1 or the substrate itself via a connecting wire 11. That is, the plurality of LED chips 10 on one side of the openings 5 are formed into a group, and the two groups of LED chips 10 on both sides of the opening 5 are connected in parallel with each other.

In addition, it may also be configured like the first embodiment that electrode lead-out wires 6 are provided at the middle portion of the substrate 1. The chips 10 on the substrate 1 are divided into a plurality of sections along the length direction. Each section of LED chips 10 include two groups of LED chips positioned on both sides of the opening 5. The two groups of LED chips are connected in parallel or in series via the middle electrode lead-out wires 6. That is, a plurality of groups of different LED chips can be arranged on the substrate 1, and each group of chips can be connected in parallel or in series according to need.

Third Embodiment

FIGS. 5, 6, 7, and 8 schematically show a substrate for LED packaging and an LED package of the third embodiment of the present invention. In this embodiment, elements and structures of the LED bulb, except for the LED package, are the same as those in the first embodiment described above, and will not be described here.

Figure 5:
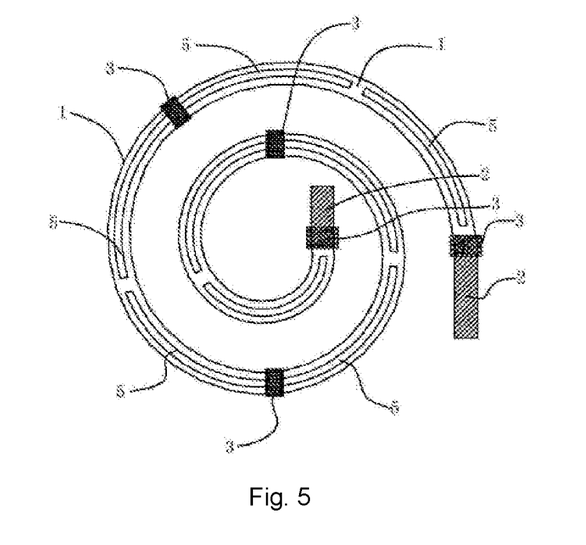
FIG. 5 is a schematic diagram of the substrate for LED packaging of the third embodiment of the present invention.

In the LED bulb of the third embodiment of the present invention, as shown in FIG. 5, the LED package includes a substrate 1. Said substrate 1 differs from the substrate of the first embodiment in that it is integrally formed by sequentially connecting a plurality of pieces of substrates end to end. Said multi-segments of substrates 1 are connected to each other by a connecting component 3 which not only structurally connects the multi-segments of substrate 1, but also electrically connects the LED chips 10 on the substrate 1. Similarly to the first embodiment, each section of the substrate 1 is provided with a plurality of openings 5 extending along the lengthwise direction of the substrate 1. The openings 5 may be distributed in the same manner as in the first and second embodiments, or provided at intervals along the lengthwise direction, or provided at parallel intervals along the width direction.

Figure 7:
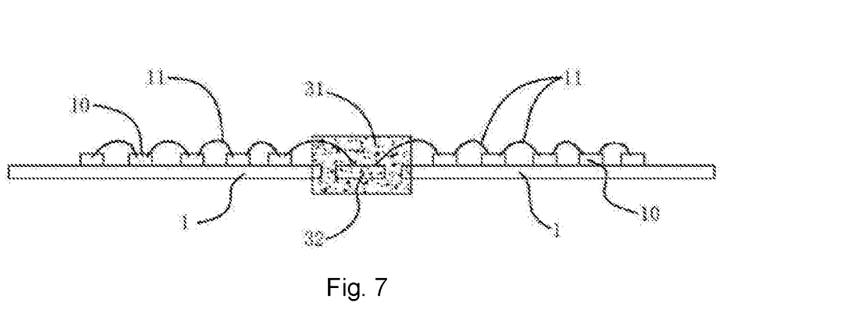
FIG. 7 is a detail side view of the middle portion of LED package of the third embodiment of the present invention.
Figure 8:
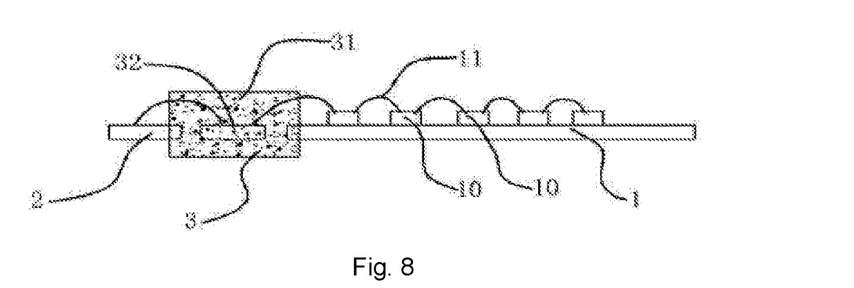
FIG. 8 is a detail side view of the end of LED package of the third embodiment of the present invention.

Preferably, the structure of the connecting component 3 is shown in FIGS. 7 and 8. As shown in FIG. 7, the connecting component 3 connects two substrates 1. As shown in FIG. 8, the connecting component 3 connects the substrate 1 and the electrode lead-out wire 2. As shown in FIG. 7, the connecting component 3 includes a non-conductive portion 31 that wraps and connects the ends of two substrates 1 to each other, and a conductive portion 32 located within the non-conductive portion 31. The conductive portions 32 are not in contact with the substrate 1 to which the connecting component 3 is connected. Since the non-conductive portion 31 is not conductive, it serves only to structurally connect the ends of the substrate 1. In FIG. 7, the LED chips 10 near the end of the substrate 1 connected to the connecting component 3 are respectively connected to the conductive portions 32 in the connecting component 3 via the connecting wires 11. The material of the non-conductive portion 31 of the connecting component 3 may be plastic, ceramic or silica gel, and the material of the conductive portion 32 may be metal.

As shown in FIG. 8, FIG. 8 is a schematic diagram of a structure in which the substrate 1 and the electrode lead-out wires 2 are connected to each other by a connecting component 3. One of the substrates 1 in FIG. 7 may be replaced by an electrode lead-out wire 2.

It is also possible to connect only the plurality of substrates 1 to each other in a structure without electrical connection by the connecting component 3 described above. That is, the LED chips on the substrate 1 may be electrically connected to each other by other lead wires provided on the substrate 1, instead of being electrically connected to each other by the connecting component 3. The connecting component 3 serves only as a connection to the substrate 1.

Figure 6:
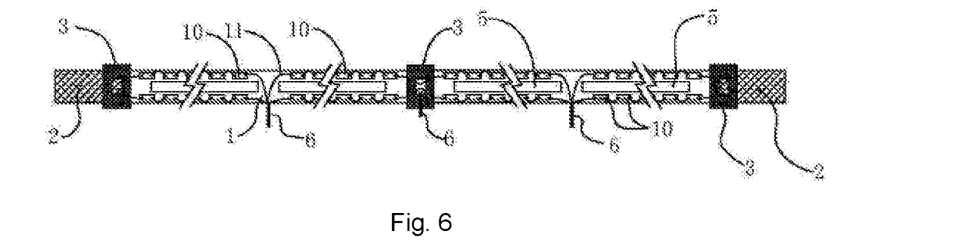
FIG. 6 is a detail diagram of LED package of the third embodiment of the present invention.

Further, as shown in FIG. 6, the middle of two substrates 1 is connected to each other via an intermediate connection component 3 that structurally connects the two substrates 1, and the connecting component 3 may also be electrically connected to the LED chips 10 on said two substrates 1 respectively. The connecting component 3 is leaded out via an electrode lead-out wire 6 electrically connected thereto, and then connected to the driver 50 and the electrical connector 60 via the electrode lead-out wire. Similarly, the structure of the connecting component 3 may function only to partition two substrates, or may also function to lead to an LED chip on the substrate. Each substrate 1 is provided with a plurality of openings 5 which are arranged with intervals along the lengthwise direction of the substrate 1 and extend along the lengthwise direction. The LED chips 10 are divided into a plurality of groups on both sides of the openings 5. The substrate 1 can also be provided with electrode lead-out wires 6 between two adjacent openings 5. The electrode leads 6 are electrically connected with the LED chips 10, so that the LED chips 10 on the substrate 1 are connected in series and/or parallel.

Such a structure can achieve a plurality of connection modes among the LED chips on the substrate 1. For example, the conductive portions 32 in the non-conductive portions 31 may be plural, each substrate 1 is provided with the openings 5 extending along its lengthwise direction, the opening 5 separates the substrate 1 into the plural portions. The LED chips 10 on the plural portions may be connected with different conductive portions 32 to realize various series and/or parallel connection of the LED chips 10.

Fourth Embodiment

Figure 9:
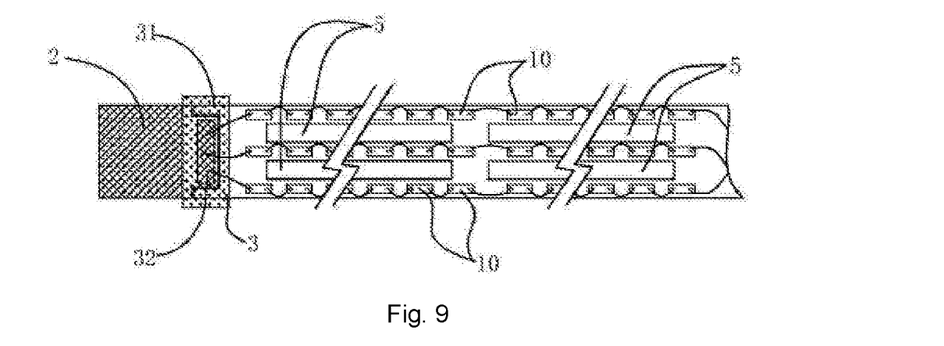
FIG. 9 is a detail view of LED package of the forth embodiment of the present invention.

FIG. 9 shows an LED package of the fourth embodiment of the present invention. In this embodiment, the elements and structures of the LED bulb, except for the LED package, are the same as those of the first embodiment described above, and therefore description thereof will not be repeated.

As shown in FIG. 9, the LED package also includes a substrate 1, an electrode lead-out wire 2, and a connecting component 3 connecting the substrate 1 and the electrode lead-out wire 2. The substrate 1 of the LED package is provided with a plurality of openings 5 which are arranged in a matrix shape and are spaced along the lengthwise direction and the width direction of the substrate 1. The plurality of columns of LED chips 10 are separated along the width direction of the substrate 1, and the LED chips 10 in each column are connected in series with each other, and the plurality of columns of the chips are connected in parallel with each other. The end portion of the substrate 1 is connected to the electrode lead-out wire 2 via a connecting component 3. The structure of the connecting component 3 may be the same as that of the connecting component 3 in the third embodiment described above. The non-conductive portion 31 of the connecting component 3 connects the electrode lead-out wire 2 and the substrate 1, and the conductive portion 32 electrically connects to the LED chip 10 and the electrode lead 2 on the substrate 1. For example, they may be connected by connecting wires 1, the conductive portion 32 is not in contact directly with either the substrate 1 or the electrode lead-out wire 2. That is, the connecting component 3 can be configured to connect two parts, or electrically connect the electrode lead-out wire 2 and the LED chip 10. The connecting component for connecting the electrode lead-out wire 2 and the substrate 1 may also be used for connecting the plurality of substrates 1.

Fifth Embodiment

Figure 10:
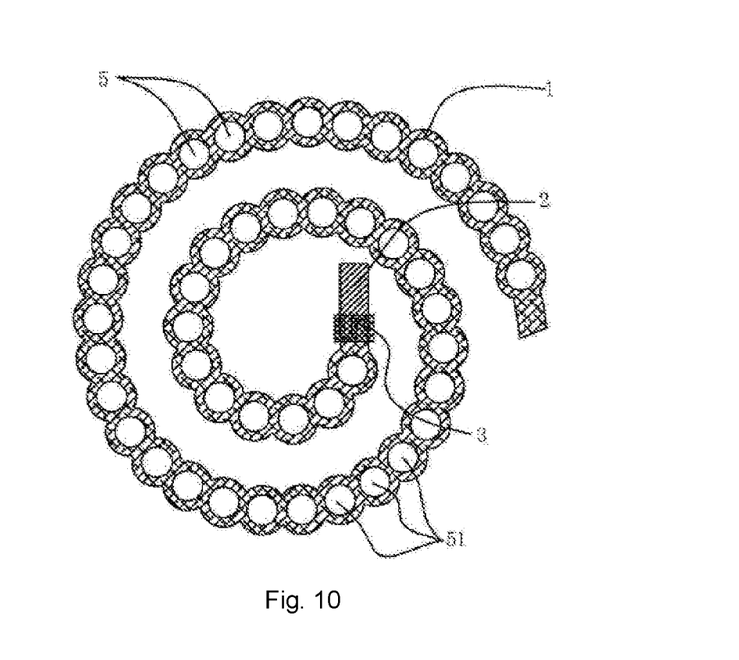
FIG. 10 is a schematic diagram of the substrate for LED packaging of the fifth embodiment of the present invention.

FIG. 10 is a schematic diagram of a substrate for LED packaging of the fifth embodiment of the present invention. In the LED bulb of this embodiment, the elements and the structure thereof are the same as those of the LED lamp bulb of the above-described first embodiment except for the LED package, and will not be described here.

In the fifth embodiment of the present invention, the LED package also includes the substrate 1, but the substrate 1 is different from the substrate structure in the first, second, third and fourth embodiments described above. The substrate 1 in the first, second, third, and fourth embodiments of the present invention is a strip-shaped substrate having the long strips with the same width, but the substrate 1 in the fifth embodiment is a plurality of circular continuous strip-shaped substrates. In the fifth embodiment, the substrate 1 also has the openings 5, but the openings 5 are a plurality of discontinuous circular through-holes 51 located on the substrate 1 and spaced apart along the lengthwise direction of the substrate 1. Further, the circular through-holes 51 are disposed concentrically with the circular outline of the outer edge of the substrate at respective corresponding positions. Accordingly, the plurality of circular through-holes 51 are spaced apart along the lengthwise direction of the substrate 1.

In the case of the same strip-shaped substrate formed by connecting a plurality of circles, the openings 5 may have a plurality of shapes such as a strip shape, and the openings 5 may span the plurality of circles. In addition, the substrate 1 may be a strip-shaped substrate formed by connecting other shapes, for example square-shaped substrates of different sizes or other shapes.

One end of the substrate 1 shown in this fifth embodiment is provided with an electrode lead-out wire 2, and the other end is not provided with an electrode lead. That is, the substrate itself is used as the other electrode lead-out wire. However, according to the above description of the present invention, it is understood that the electrode lead-out wires may be provided at both ends of the substrate, or a plurality of electrode lead-out wires may be provided at two ends of the substrate and in the middle of the substrate.

The shape of the substrate 1 may be an arc shape, a wave shape, or a strip shape in which a plurality of polygons are connected to each other. It will be appreciated from this embodiment that the openings 5 in the substrate may also be of various shapes, such as be elongated openings, a plurality of circular openings, irregularly shaped openings, other regularly shaped openings, such as square, polygonal, and so on. Further, the openings 5 may be plural, and the plurality of openings may be spaced apart along the lengthwise direction of the substrate, or may be spaced apart along the width direction.

As shown in FIG. 10, the LED package according to this fifth embodiment includes the substrate 1, an electrode lead-out wire 2 provided at the end of the substrate 1, and a connecting component 3 and/or a connection material connecting the electrode lead-out wire 2 and the substrate 1. In addition, the LED package includes a plurality of LED chips fixedly disposed on the substrate 1 on both sides of the opening 5, and the LED chips are fixed to the substrate 1 by a non-conductive adhesive (e.g., silica gel, modified resin, epoxy resin, etc.) or a conductive adhesive (e.g., silver glue, copper glue, etc.). The connecting wire may be use to connect the LED chips, and between the LED chip and the electrode lead-out wire. The LED chips on the substrate 1 on both sides of each opening 5 can be connected in series or in parallel with each other via connecting wires, and can also be connected in series and in parallel with each other. The user can connect the LED chips according to needs.

According to the LED package or the LED bulb of the fifth embodiment of the invention, the LED chips on the substrate can be connected in series or in parallel through an opening in the middle of the substrate, and the LED chips can be conveniently arranged into different light-emitting areas. The LED chips of the different light-emitting areas can form different colors, color temperatures, brightness, display contents, etc. The LED chips of the different areas can be individually controlled by circuits to form an intelligent lighting control system. In addition, the light of the LED chip can be transmitted to the back surface or other surfaces through the opening 5, so that more omni bearing light transmission is achieved. The opening is favorable for air ventilation and heat dissipation of the package, and prolonging the life of the LED bulb.

Although the preferred embodiment of the invention is described in detail above, it should be clearly understood that various modifications and variations of the present invention will occur to those skilled in the art. Any modification, equivalent substitution, improvement, etc. that come within the spirit and principles of the invention shall be included in the protection scope of the invention.

The invention claimed is:

1. A substrate for LED packaging, wherein said substrate is shaped in a strip, at least one end of said substrate has an electrode lead-out wire, said electrode lead-out wire is connected with said substrate by connective components and/or connective materials; and said substrate has at least one strip-shaped opening disposed along the lengthwise direction of the substrate.

2. The substrate for LED packaging in claim 1, wherein said substrate is shaped in spiral lines, and the spiral lines of said substrate are spaced.

3. The substrate for LED packaging in claim 2, wherein multiple said openings are provided, said openings are arranged with interval along the lengthwise direction of the substrate, or are arranged with interval along the width direction of the substrate, or are arranged with intervals both along the lengthwise direction of the substrate and along the width direction of the substrate.

4. The substrate for LED packaging in claim 3, wherein said substrate is in an arc shape, a wave shape, or a strip shape formed by connecting a plurality of units.

5. The substrate for LED packaging in claim 1, wherein said substrate comprises a plurality of segments, and multiple said substrates are connected sequentially end to end.

6. The substrate for LED packaging in claim 5, wherein multiple said substrates are connected with each other via a connective component, and adjacent substrates are connected structurally to each other by said the connective component.

7. The substrate for LED packaging in claim 6, wherein said connective component electrically connects circuit elements on the adjacent substrates, said connective component comprises a non-conductive portion that wraps and connects the end portion of the adjacent substrates and a conductive portion located within the non-conductive portion, said conductive portion electrically connects to the circuit elements on the substrate via connecting wires.

8. A LED package comprising a substrate on which a plurality of LED chips are arranged, wherein said substrate is the substrate in claim 1, and said plurality of LED chips on the substrate are connected in series and/or parallel with each other via connecting wires.

9. The LED package in claim 8, wherein said substrate is provided with LED chips on both sides of said at least one strip-shaped opening.

10. The LED package in claim 9, wherein said connective component comprises a non-conductive portion that wraps and connects the ends of adjacent substrates and a conductive portion located within the non-conductive portion, the conductive portion is not in contact with the substrate connected by said connective component, and the conductive portion is electrically connected to the LED chip on the substrate via connective wires.

11. The LED package in claim 9, wherein the middle part of said substrate is provided with an electrode lead-out wire, wherein the electrode lead-out wire is electrically connected with an LED chip on the substrate.

12. The LED package in claim 10, wherein said connective component is electrically connected to an LED chip on at least part substrate of the multiple substrates, and the connective component is electrically connected to an electrode lead-out wire via which it is connected to the power supply.

13. An LED package comprising a substrate, wherein at least one end of said substrate has an electrode lead-out wire, said electrode lead-out wire is connected with said substrate by connective components and/or connective materials; said substrate has a plurality of openings disposed along the lengthwise direction of said substrate; each opening having a first side and a second side; said substrate is provided with LED chips positioned on both the first and second sides of said openings; said LED chips on the substrate are connected in series and/or parallel with each other via connective wires; said substrate is in a strip shape formed by connecting a plurality of polygonal units or a plurality of circular units.

14. The LED package in claim 13, wherein said substrate is in a strip shape formed by connecting a plurality of circular units, and said plurality of openings are a plurality of circular through-holes which are arranged concentrically with the corresponding circular units and are distributed with intervals along the lengthwise direction of said substrate.

15. An LED bulb comprising a transparent bubble shell, a stem arranged in the transparent bubble shell bulb, at least one LED package, an electrical connector positioned below the transparent bubble shell, and a driver connected with the electrical connector and positioned in the electrical connector, wherein said stem is provided with two lead-out wires, the lead-out wires are respectively connected with electrode lead-out wires of the LED package in said transparent bubble shell, and the other end of the lead-out wires are connected with the driver, so that said LED package is connected with said electric connector by said driver, said transparent bubble shell and the stem are sealed, and a closed space is formed in the transparent bubble shell, wherein the LED package is the LED package in claim 11.

16. The substrate for LED packaging in claim 4, wherein said substrate comprises a plurality of segments, and multiple said substrates are connected sequentially end to end.

17. A LED package comprising a substrate on which a plurality of LED chips are arranged, wherein said substrate is the substrate in claim 4, and said plurality of LED chips on the substrate are connected in series and/or parallel with each other via connecting wires.

18. The LED package in claim 17, wherein the middle part of said substrate is provided with an electrode lead-out wire, wherein the electrode lead-out wire is electrically connected with an LED chip on the substrate.

19. An LED bulb comprising a transparent bubble shell, a stem arranged in the transparent bubble shell bulb, at least one LED package, an electrical connector positioned below the transparent bubble shell, and a driver connected with the electrical connector and positioned in the electrical connector, wherein said stem is provided with two lead-out wires, the lead-out wires are respectively connected with electrode lead-out wires of the LED package in said transparent bubble shell, and the other end of the lead-out wires are connected with the driver, so that said LED package is connected with said electric connector by said driver, said transparent bubble shell and the stem are sealed, and a closed space is formed in the transparent bubble shell, wherein the LED package is the LED package in claim 13.

* * * * *